(12) United States Patent
Uchida et al.

(10) Patent No.: US 7,914,626 B2
(45) Date of Patent: Mar. 29, 2011

(54) LIQUID PROCESSING METHOD AND LIQUID PROCESSING APPARATUS

(75) Inventors: Noritaka Uchida, Koshi (JP); Mitsunori Nakamori, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 918 days.

(21) Appl. No.: 11/602,398

(22) Filed: Nov. 21, 2006

(65) Prior Publication Data

US 2007/0113872 A1 May 24, 2007

Related U.S. Application Data

(60) Provisional application No. 60/739,454, filed on Nov. 25, 2005, provisional application No. 60/739,914, filed on Nov. 28, 2005.

(30) Foreign Application Priority Data

Nov. 24, 2005 (JP) .................................. 2005-339133
Dec. 16, 2005 (JP) .................................. 2005-362809

(51) Int. Cl.
*B08B 3/00* (2006.01)

(52) U.S. Cl. ................. 134/30; 134/26; 134/32; 134/33; 134/34; 134/42

(58) Field of Classification Search .................... 134/26, 134/30, 33, 32, 34, 42
See application file for complete search history.

(56) References Cited

U.S. PATENT DOCUMENTS

| | | | | |
|---|---|---|---|---|
| 2002/0096196 | A1* | 7/2002 | Toshima et al. | 134/21 |
| 2003/0172955 | A1* | 9/2003 | Kuroda et al. | 134/2 |
| 2004/0200513 | A1* | 10/2004 | Okuda et al. | 134/102.1 |

FOREIGN PATENT DOCUMENTS

| | | |
|---|---|---|
| JP | 4-206544 | 7/1992 |
| JP | 2001-46815 | 2/2001 |
| JP | 2002-219424 | 8/2002 |
| JP | 2002-343759 | 11/2002 |
| JP | 2003-224100 | 8/2003 |
| JP | 2003-275696 | 9/2003 |
| JP | 2003-282425 | 10/2003 |
| JP | 2003-282514 | 10/2003 |
| JP | 2003-297788 | 10/2003 |
| JP | 2003-309102 | 10/2003 |
| JP | 2003-332284 | 11/2003 |
| JP | 2004-119717 | 4/2004 |
| JP | 2004-235559 | 8/2004 |
| WO | 2005/050724 | 6/2005 |

OTHER PUBLICATIONS

Japanese Office Action issued on Sep. 7, 2010 for Japanese Patent Application No. 2005-339133 with English translation.
Japanese Office Action issued on Sep. 14, 2010 for Japanese Patent Application No. 2005-362809 with English translation.

* cited by examiner

*Primary Examiner* — Michael Kornakov
*Assistant Examiner* — Douglas Lee
(74) *Attorney, Agent, or Firm* — Smith, Gambrell & Russell, LLP

(57) ABSTRACT

A liquid processing method includes: placing a plate adjacently to at least one of surfaces of a target substrate, and supplying a process liquid into a gap between the plate and the target substrate, thereby forming a liquid film of the process liquid; subjecting the target substrate to a process using a state with the liquid film of the process liquid thus formed; and supplying a gas to the liquid film, thereby breaking the liquid film, after finishing the process.

17 Claims, 10 Drawing Sheets

LIQUID PROCESSING METHOD AND LIQUID PROCESSING APPARATUS

CROSS REFERENCE TO RELATED APPLICATIONS

This application claims benefit to provisional application No. 60/739,454, filed on Nov. 25, 2005, and to provisional application No. 60/739,914, filed on Nov. 28, 2005. Both provisional applications are incorporated herein. This application further claims benefit of priority from JP2005-339133, filed in Japan on Nov. 24, 2005, and JP2005-362809, filed in Japan on Dec. 16, 2005.

BACKGROUND OF THE INVENTION

1. Field of the Invention

The present invention relates to a liquid processing method and liquid processing apparatus for performing a liquid process, such as cleaning, on a target substrate, such as a semiconductor wafer or a glass substrate for a flat panel display (FPD), representative of which is a liquid crystal display (LCD). The present invention also relates to a control program and computer readable storage medium for executing a liquid processing method of this kind.

2. Description of the Related Art

In the process of manufacturing semiconductor devices, a cleaning process is performed by supplying a predetermined chemical liquid (cleaning liquid) to clean a semiconductor wafer (which will be simply referred to as "wafer", hereinafter), so that contaminants, such as particles, organic contaminants, and metal impurities, and polymers remaining after an etching process are removed from the wafer.

As a wafer cleaning apparatus for performing such a cleaning process, a wafer cleaning apparatus of the single-wafer type is known, as follows. Specifically, at first, a chemical liquid is supplied onto the front and back surfaces of a wafer held on a spin chuck, while the wafer is set in a stationary state or in a rotated state, to perform a chemical liquid process. Then, a rinsing liquid, such as purified water, is supplied onto the wafer, while the wafer is rotated at a predetermined rotation number, to wash away the chemical liquid. Then, the wafer is rotated to perform a drying process.

Jpn. Pat. Appln. KOKAI Publication No. 2003-224100 discloses a technique in light of economical efficiency for a wafer cleaning apparatus of the single-wafer type, in which a cleaning process is performed while a chemical liquid puddle (liquid film) is formed on the cleaning target surface of a wafer, so that the chemical liquid consumption can be as little as possible. Specifically, for example, a plate for forming a chemical liquid puddle is disposed to face the back surface of a wafer. Then, while this plate is set to be adjacent to the back surface of the wafer, a chemical liquid is supplied into the gap between the wafer and plate from a nozzle disposed on the plate to form a puddle. The plate is arranged to be movable up and down, so that the plate is moved down, after the chemical liquid cleaning, to expand the gap between the plate and wafer. In this state, a rinsing process and a drying process are performed, while the wafer is rotated at a high speed. During the chemical liquid process, the gap between the plate and wafer is set to be as small as possible to decrease the chemical liquid consumption per wafer.

However, when the plate is moved down to separate it from the wafer, or when the wafer is rotated at a high speed thereafter, the liquid volume within the gap becomes smaller than the gap volume. Consequently, the gap falls into a vacuum state, and the wafer is thereby stuck on the plate and may suffer warp and/or crack generation.

BRIEF SUMMARY OF THE INVENTION

An object of the present invention is to provide a liquid processing method and liquid processing apparatus, which can prevent a target substrate from suffering warp and/or crack generation when a liquid process is performed while using a plate to form a liquid film on the target substrate.

Another object of the present invention is to provide a control program and computer readable storage medium for executing a method of this kind.

A according to a first aspect of the present invention, there is provided a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film thus formed; and supplying a gas to the liquid film of the process liquid, thereby breaking the liquid film, after finishing the process.

In the liquid processing method according to the first aspect, the process liquid may be supplied into the gap between the plate and the target substrate from a nozzle disposed at a central portion of the plate. The process liquid of the liquid film may be a chemical liquid at least when the liquid film is formed. In this case, after forming the liquid film from the chemical liquid used as the process liquid and before breaking the liquid film, the method may further comprise supplying a rinsing liquid into the gap between the plate and the target substrate, thereby replacing the chemical liquid of the liquid film partly or entirely with the rinsing liquid. The method may further comprise releasing pressure inside a gas line for supplying the gas to the liquid film before breaking the liquid film. The method may further comprise: expanding the gap between the plate and the target substrate while rotating the target substrate at a first rotation number that defines a relatively lower speed; and then increasing the rotation number of the target substrate to a second rotation number that defines a higher speed than the speed defined by the first rotation number. In this case, the first rotation number may be set to be 10 to 100 rpm, and the second rotation number may be set to be 100 to 1,000 rpm. The method may further comprise: supplying a rinsing liquid onto the target substrate while rotating the target substrate; and rotating the target substrate, thereby performing throwing-off and drying.

A according to a second aspect of the present invention, there is provided a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film thus formed; supplying a gas to the liquid film, thereby breaking the liquid film, after finishing the process; expanding the gap between the plate and the target substrate; removing the liquid film from the target substrate; performing rinsing on a surface of the target substrate facing the plate; and performing throwing-off and drying on the target substrate.

A according to a third aspect of the present invention, there is provided a liquid processing method comprising: placing a plate adjacently to a back surface of a target substrate, and supplying a process liquid into a gap between the plate and the target substrate, thereby forming a liquid film of the process liquid; subjecting the target substrate to a process using a state with the liquid film thus formed; supplying a gas to the liquid film, thereby breaking the liquid film, after finishing the process; expanding the gap between the plate and the target substrate while rotating the target substrate at a first rotation number that defines a relatively lower speed; increasing the rotation number of the target substrate to a second rotation number that defines a relatively higher speed, thereby removing the liquid film from the back surface of the target substrate; supplying a rinsing liquid onto the back surface of the target substrate while rotating the target substrate, thereby performing rinsing thereon; supplying a process liquid onto a front surface of the target substrate, thereby subjecting the front surface to a process, while the process on the back surface of the target substrate is proceeding; supplying a rinsing liquid onto the front surface of the target substrate, thereby performing rinsing thereon, after finishing the process on the front surface of the target substrate; and switching the rinsing liquid supplied onto the front surface of the target substrate to a two-fluid spray comprising purified water atomized by a gas, at timing when the first rotation number is increased to the second rotation number.

In the liquid processing method according to the third aspect, the first rotation number may be set to be 10 to 100 rpm, and the second rotation number may be set to be 100 to 1,000 rpm. The method may further comprise rotating the target substrate at a high speed, thereby performing throwing-off and drying.

A according to a fourth aspect of the present invention, there is provided a liquid processing method comprising: placing a plate to face at least one of surfaces of a target substrate with a first distance therebetween, and supplying a liquid into a gap between the plate and the target substrate, thereby performing a liquid process; stopping supply of the liquid, and then supplying a gas into the gap between the plate and the target substrate with the first distance therebetween; and expanding the distance between the plate and the target substrate to a second distance larger than the first distance, while supplying the gas.

In the liquid processing method according to the fourth aspect, the method may further comprise: rotating the target substrate, while supplying the gas into the gap between the plate and the target substrate with the first distance therebetween; and providing an increase in rotation number of the target substrate, when expanding the distance between the plate and the target substrate to the second distance while supplying the gas. The method may further comprise supplying a rinsing liquid into the gap between the plate and the target substrate. After supplying the rinsing liquid, the method may further comprise expanding the distance between the plate and the target substrate to a third distance larger than the second distance, and stopping supply of the rinsing liquid. The liquid supplied into the gap between the plate and the target substrate with the first distance therebetween may be a chemical liquid, or may be a chemical liquid and a rinsing liquid supplied subsequently to a chemical liquid process.

According to a fifth aspect of the present invention, there is provided a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film thus formed; and expanding the gap having the liquid film of the process liquid formed therein, while supplying a liquid-phase fluid into the gap to follow a change of the gap, thereby breaking the liquid film, after finishing the process.

In the liquid processing method according to the fifth aspect, the process liquid may be supplied into the gap between the plate and the target substrate from a nozzle disposed at a central portion of the plate. The process liquid for forming the liquid film may be a chemical liquid. The liquid-phase fluid may be a rinsing liquid. The method may further comprise: rotating the target substrate at a first rotation number that defines a relatively lower speed, while breaking the liquid film; and then further expanding the gap while increasing the rotation number of the target substrate to a second rotation number that defines a higher speed than the speed defined by the first rotation number. In this case, the first rotation number may be set to be 10 to 100 rpm, and the second rotation number may be set to be 100 to 1,000 rpm. The method may further comprise: supplying a rinsing liquid onto the target substrate while rotating the target substrate; and rotating the target substrate, thereby performing throwing-off and drying.

According to a sixth aspect of the present invention, there is provided a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film thus formed; expanding the gap having the liquid film of the process liquid formed therein, while supplying a liquid-phase fluid into the gap to follow a change of the gap, thereby breaking the liquid film, after finishing the process; removing the liquid film from the gap; performing rinsing on a surface of the target substrate facing the plate; and performing throwing-off and drying on the target substrate.

According to a seventh aspect of the present invention, there is provided a liquid processing method comprising: placing a plate adjacently to a back surface of a target substrate, and supplying a process liquid into a gap between the plate and the target substrate, thereby forming a liquid film of the process liquid; subjecting the target substrate to a process using a state with the liquid film thus formed; rotating the target substrate at a first rotation number that defines a relatively lower speed, and expanding the gap having the liquid film of the process liquid formed therein, while supplying a liquid-phase fluid into the gap to follow a change of the gap, thereby breaking the liquid film, after finishing the process; increasing the rotation number of the target substrate to a second rotation number that defines a relatively higher speed, thereby removing the liquid film from the gap; supplying a rinsing liquid onto the back surface of the target substrate while rotating the target substrate, thereby performing rinsing thereon; supplying a process liquid onto a front surface of the target substrate, thereby subjecting the front surface to a process, while the process on the back surface of the target substrate is proceeding; supplying a rinsing liquid onto the front surface of the target substrate, thereby performing rinsing thereon, after finishing the process on the front surface of the target substrate; and switching the rinsing liquid supplied onto the front surface of the target substrate to a two-fluid spray comprising purified water atomized by a gas, at timing when the first rotation number is increased to the second rotation number.

In the liquid processing method according to the seventh aspect, the first rotation number may be set to be 10 to 100 rpm, and the second rotation number may be set to be 100 to 1,000 rpm. The method may further comprise rotating the target substrate at a high speed, thereby performing throwing-off and drying.

According to an eighth aspect of the present invention, there is provided a liquid processing method comprising: placing a plate to face at least one of surfaces of a target substrate with a first distance therebetween, and supplying a first liquid into a gap between the plate and the target substrate, thereby performing a liquid process; expanding the gap having the liquid film of the process liquid formed therein to a second distance, while supplying a second liquid into the gap to follow a change of the gap, thereby breaking the liquid film, after finishing the process; and expanding the gap further to a third distance, and removing the liquid film.

In the liquid processing method according to the eighth aspect, the method may further comprise rotating the target substrate at a first rotation number while breaking the liquid film, and increasing the rotation number of the target substrate to a second rotation number that defines a higher speed than a speed defined by the first rotation number, thereby removing the liquid film. After removing the liquid film, the method may further comprise supplying a rinsing liquid into the gap between the plate and the target substrate. The first liquid may be a chemical liquid and the second liquid may be a rinsing liquid.

A according to a ninth aspect of the present invention, there is provided a liquid processing apparatus comprising: a substrate holding portion configured to hold a target substrate in a horizontal state; at least one plate configured to be placed at a position adjacent to at least one of surfaces of the target substrate, and to be separated therefrom; a process liquid supply member configured to supply a process liquid into a gap between the plate and the target substrate to form a liquid film of the process liquid; a gas supply mechanism configured to supply a gas to the liquid film to break the liquid film; and a control mechanism configured to carry out control such that, after a process using the liquid film is finished, the gas is supplied to the liquid film to break the liquid film, and then the plate is separated from the target substrate.

According to a tenth aspect of the present invention, there is provided a liquid processing apparatus comprising: a substrate holding portion configured to hold a target substrate in a horizontal state; at least one plate configured to be placed at a position adjacent to at least one of surfaces of the target substrate, and to be separated therefrom; a process liquid supply member configured to supply a process liquid into a gap between the plate and the target substrate to form a liquid film of the process liquid; a liquid-phase fluid supply mechanism configured to supply a liquid-phase fluid into the gap; and a control mechanism configured to carry out control such that, after a process using the liquid film is finished, the gap having the liquid film of the process liquid formed therein is expanded, while the liquid-phase fluid is supplied into the gap to follow a change of the gap, so as to break the liquid film.

A according to an eleventh aspect of the present invention, there is provided a computer readable storage medium that stores a control program for execution on a computer, wherein the control program, when executed, causes the computer to control a liquid processing apparatus to conduct a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film of the process liquid thus formed; and supplying a gas to the liquid film of the process liquid, thereby breaking the liquid film, after finishing the process.

According to a twelfth aspect of the present invention, there is provided a computer readable storage medium that stores a control program for execution on a computer, wherein the control program, when executed, causes the computer to control a liquid processing apparatus to conduct a liquid processing method comprising: placing a plate adjacently to at least one of surfaces of a target substrate, and supplying a process liquid into a gap between the plate and the target substrate, thereby forming a liquid film of the process liquid; subjecting the target substrate to a process using a state with the liquid film thus formed; and expanding the gap having the liquid film of the process liquid formed therein, while supplying a liquid-phase fluid into the gap to follow a change of the gap, thereby breaking the liquid film, after finishing the process.

According to one manner of the present invention, a plate is placed adjacently to at least one of surfaces of a target substrate, and a process liquid is supplied into a gap between the plate and the target substrate, so that a liquid film of the process liquid is formed. Then, the target substrate is subjected to a process using a state with the liquid film thus formed. Then, a gas is supplied to the liquid film of the process liquid to break the liquid film, after the process is finished. Consequently, when the plate is separated from the target substrate, the gap between the plate and the target substrate does not fall into a vacuum state, and the target substrate is thereby prevented from suffering warp and/or crack generation.

According to another manner of the present invention, a plate is placed adjacently to at least one of surfaces of a target substrate, and a process liquid is supplied into a gap between the plate and the target substrate, so that a liquid film of the process liquid is formed. Then, the target substrate is subjected to a process using a state with the liquid film thus formed. After the process is finished, the gap having the liquid film of the process liquid formed therein is expanded, while a liquid is supplied into the gap, to break the liquid film. Consequently, when the gap between the target substrate and the plate is expanded, the gap does not fall into a vacuum state, and the target substrate is thereby prevented from suffering warp and/or crack generation. Further, once the liquid film is broken, another liquid film is not formed in the gap thereafter, and thus the rotation number of the substrate can be increased for the subsequent step.

DETAILED DESCRIPTION OF THE INVENTION

An embodiment of the present invention will now be described with reference to the accompanying drawings. Hereinafter, an explanation will be given of a case where the present invention is applied to a cleaning apparatus that can perform cleaning processes on the front and back surfaces of a wafer simultaneously.

Figure 1:
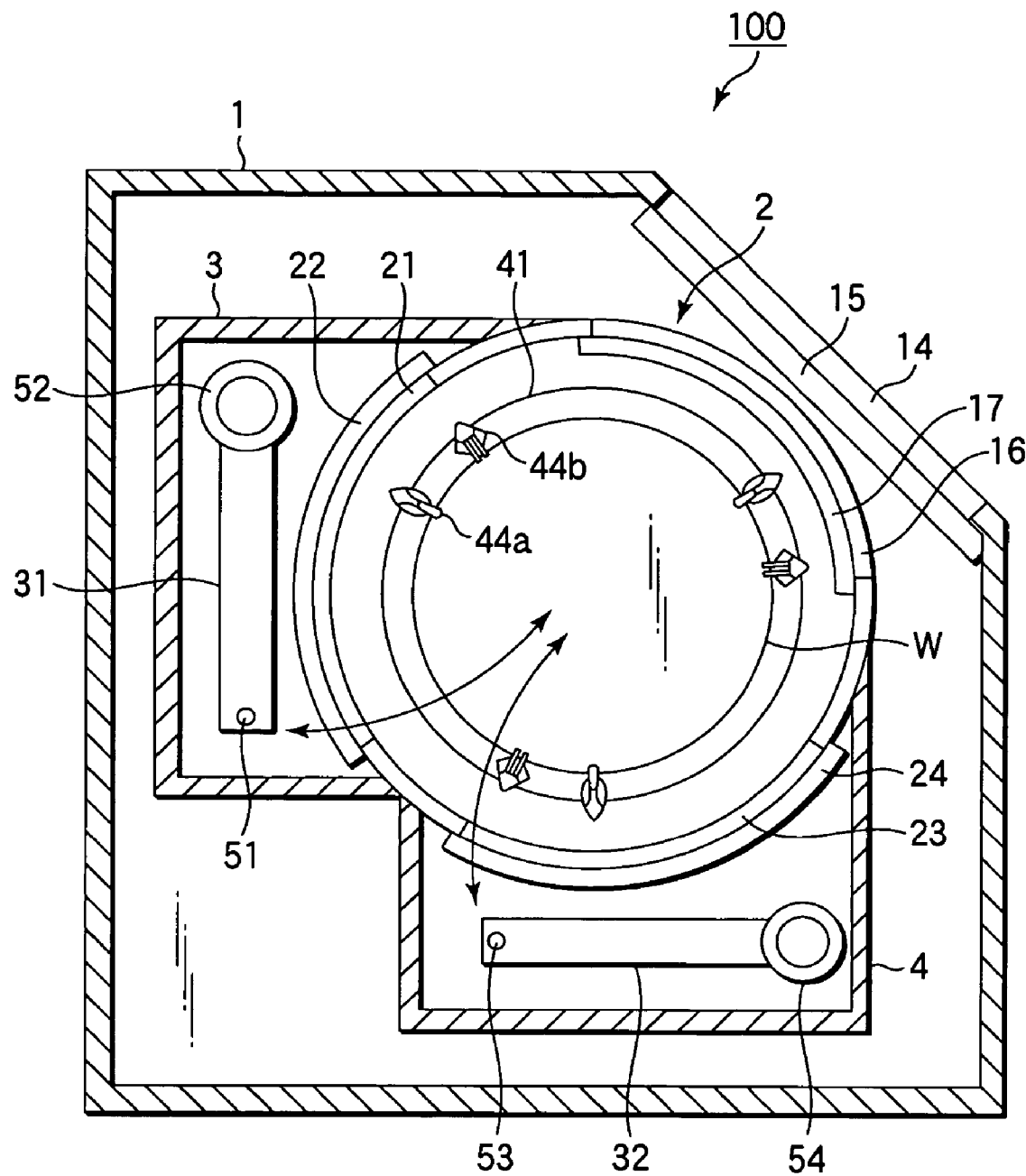
FIG. 1 is a plan view schematically showing an example of a cleaning apparatus usable for performing a method according to an embodiment of the present invention.
Figure 2:
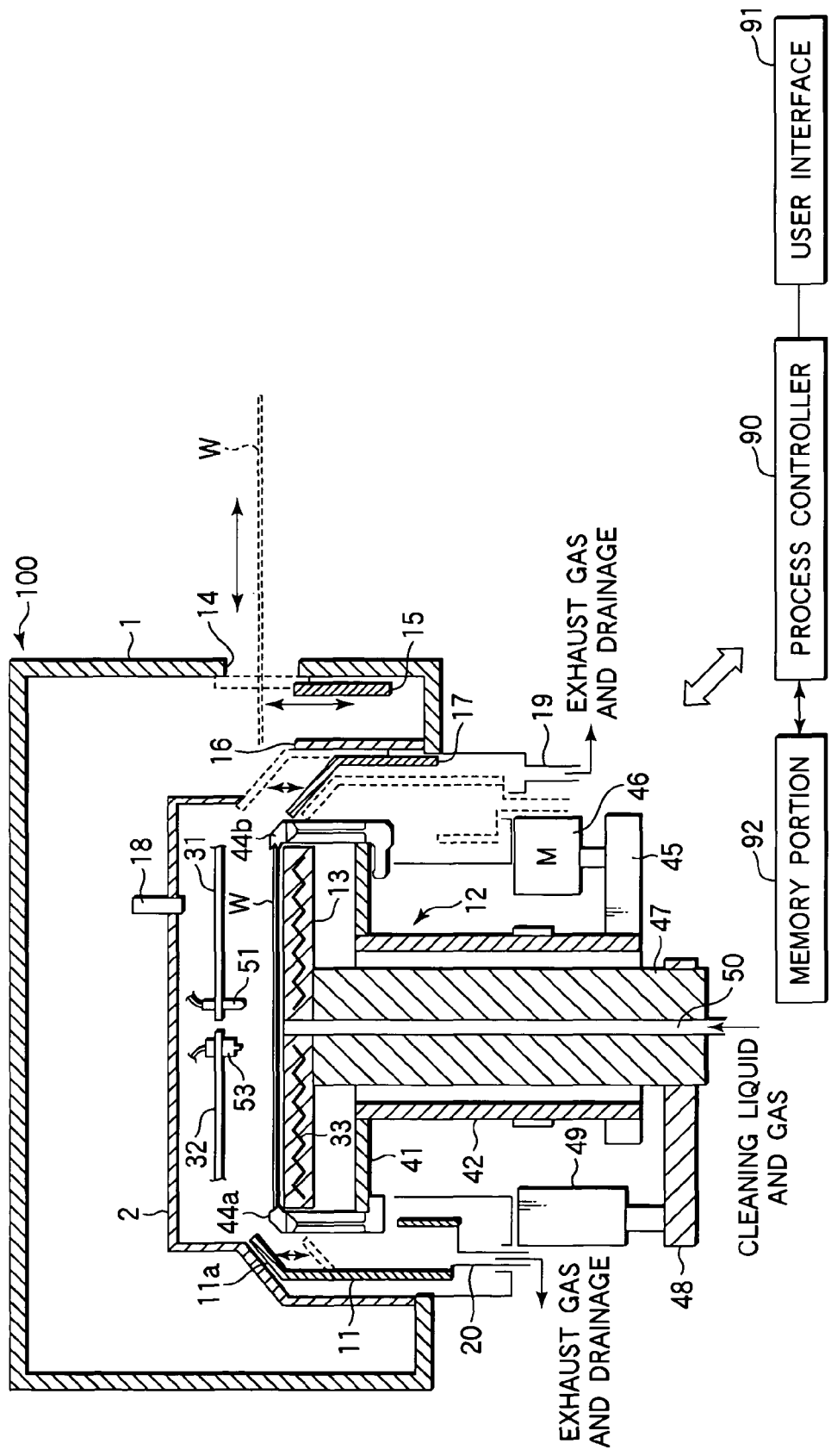
FIG. 2 is a sectional view schematically showing the cleaning apparatus shown in FIG. 1.

FIG. 1 is a plan view schematically showing an example of a cleaning apparatus usable for performing a method according to an embodiment of the present invention. FIG. 2 is a sectional view schematically showing the cleaning apparatus shown in FIG. 1. The cleaning apparatus 100 includes a housing 1, in which an outer chamber 2, a liquid delivery nozzle arm shed 3, and a two-fluid spray nozzle arm shed 4 are disposed. The outer chamber 2 is arranged to accommodate a wafer to be subjected to a cleaning process. The liquid delivery nozzle arm shed 3 is arranged to store a liquid delivery nozzle arm 31 for a liquid delivery nozzle. The two-fluid spray nozzle arm shed 4 is arranged to store a two-fluid spray nozzle arm 32 for a two-fluid spray nozzle.

Further, the cleaning apparatus 100 includes an inner cup 11 (FIG. 2) disposed inside the outer chamber 2. A spin chuck 12 is disposed inside the inner cup 11 to hold a wafer W. An under plate 13 is disposed to face the back surface of the wafer W held by the spin chuck 12 and to be movable up and down.

The housing 1 has a window portion 14 formed therein as a wafer transfer port and provided with a first shutter 15 capable of opening/closing the window portion 14. The window portion 14 is set in an opened state when the wafer W is loaded or unloaded, and is otherwise set in the closed state by the first shutter 15. The first shutter 15 is arranged to open and close the window portion 14 from inside the housing 1, so that the inner atmosphere of the housing 11 is effectively prevented from leaking even when the interior of the housing 1 has a positive pressure.

The outer chamber 2 has a window portion 16 formed in the sidewall as a wafer transfer port at a position corresponding to the window portion 14. The window portion 16 is provided with a second shutter 17 capable of opening/closing the window portion 16. The window portion 16 is set in an opened state when the wafer W is loaded or unloaded, and is otherwise set in the closed state by the second shutter 17. The wafer W is subjected to a cleaning process within the outer chamber 2. When the wafer W is loaded or unloaded, both the window portions 14 and 16 are set in an opened state. Then, a transfer arm (not shown) is inserted into the outer chamber 2 from outside, and the wafer W is transferred to the spin chuck 12 or from the spin chuck 12.

The second shutter 17 is arranged to open and close the window portion 16 from inside the outer chamber 2, so that the inner atmosphere of the outer chamber 2 is effectively prevented from leaking even when the interior of the outer chamber 2 has a positive pressure.

A gas supply port 18 is disposed on the top wall of the outer chamber 2 to supply an inactive gas, such as $N_2$ gas, into the outer chamber 2. The gas supply port 18 is arranged to form a downflow within the outer chamber 2, so that the outer chamber 2 is prevented from being filled with vapor of a chemical liquid delivered onto the wafer W held by the spin chuck 12. Further, where this downflow is formed, there is also provided the effect of preventing water marks from being formed on the front surface of the wafer W. The outer chamber 2 has a drain portion 19 formed at the bottom, so that gas and liquid can be exhausted through the drain portion 19.

The inner cup 11 surrounds the spin chuck 12, so that the chemical liquid and/or purified water delivered onto the wafer W are prevented from scattering around the inner cup 11. The inner cup 11 has a tapered portion 11a formed on the upper side, and a drain portion 20 formed in the bottom wall. The inner cup 11 is movable up and down between a process position (denoted by a solid line in FIG. 2) and a retreat position (denoted by a dotted line in FIG. 2). In the process position, the upper end of the inner cup 11 is positioned higher than the wafer W held by the spin chuck 12 and the tapered portion surrounds the wafer W. In the retreat position, the upper end of the inner cup 11 is positioned lower than the wafer W held by the spin chuck 12.

When the wafer W is loaded or unloaded, the inner cup 11 is set in the retreat position so as not to obstruct the incoming/outgoing movement of the transfer arm (not shown). On the other hand, when a cleaning process is performed on the wafer W held by the spin chuck 12, the inner cup 11 is set in the process position. The chemical liquid used for the cleaning process of the wafer W is guided into the drain portion 20. The drain portion 20 is connected to a chemical liquid recovery line and an exhaust duct (both not shown). With this arrangement, mist or the like generated within the inner cup 11 is prevented from diffusing into the outer chamber 12.

The spin chuck 12 includes a rotary plate 41 and a rotary cylindrical body 42 connected to the rotary plate 41 at the central portion thereof and extending downward from the rotary plate 41. Support pins 44a for supporting the wafer W and holding pins 44b for holding the wafer W are attached to the peripheral portion of the rotary plate 41. When the wafer W is transferred between the transfer arm (not shown) and spin chuck 12, the support pins 44a are utilized for this transfer. In order to reliably support the wafer W, the support pins 44a are preferably disposed in at least three positions. The holding pins 44b are arranged not to obstruct the operation for transferring the wafer W between the transfer arm (not shown) and spin chuck 12. For this purpose, a pushing mechanism (not shown) is disposed to push the portions of the holding pins 44b below the rotary plate 41 toward the rotary plate 41, so that the upper ends of the holding pins 44b are inclined out of the rotary plate 41. In order to reliably hold the wafer W, the holding pins 44b are preferably disposed in at least three positions.

A belt 45 is wound around the outer surface of the rotary cylindrical body 42 near the lower end, and is arranged to be driven by a motor 66. With this arrangement, the rotary cylindrical body 42 and rotary plate 41 are rotatable along with the wafer W held by the holding pins 44b.

The under plate 13 is connected to a shaft (support column) 47 extending through the central portion of the rotary plate 41 and the rotary cylindrical body 42. The lower end of the shaft 47 is fixed to a horizontal plate 48. The horizontal plate 48 and the shaft 47 are integrally movable up and down by an elevating mechanism 49, such as an air cylinder. When the wafer W is transferred between the spin chuck 59 and transfer arm (not shown), the under plate 13 is moved down by the elevating mechanism 49 to a position adjacent to the rotary plate 41 so as not to collide with the transfer arm. When a puddle (liquid film) is formed to perform a cleaning process on the back surface of the wafer W, the under plate 13 is moved up by the elevating mechanism 49 to a position adjacent to the back surface of the wafer W. After the cleaning process utilizing a puddle is finished, the under plate 13 is moved down by the elevating mechanism 49 to a suitable position. It may be arranged such that the rotary cylindrical body 42 is moved up and down while the under plate 13 is set stationary at a prescribed height, to adjust the relative positions of the wafer W held by the holding pin 44b and the under plate 13.

A back surface cleaning nozzle 50 is formed in the under plate 13 and shaft 47 to extend therethrough. The back surface cleaning nozzle 50 is arranged to supply a chemical liquid used as a cleaning liquid, purified water used as a rinsing liquid, and a liquid film breaking gas (for example, nitrogen gas) toward the back surface of the wafer W. The under plate 13 has a heater 33, built therein and arranged to be supplied with electricity from a power supply (not shown), to control the temperature of the wafer W through the under plate 13.

The liquid delivery nozzle arm shed 3 has a window portion 21 formed adjacently to the outer chamber 2 and provided with a third shutter 22 capable of opening/closing the window portion 21. The third shutter 22 is set in the closed state when the liquid delivery nozzle arm shed 3 is isolated from the atmosphere inside the outer chamber 2. The two-fluid spray nozzle arm shed 4 has a window portion 23 formed adjacently to the outer chamber 2 and provided with a fourth shutter 24 capable of opening/closing the window portion 23. The fourth shutter 24 is set in the closed state when the two-fluid spray nozzle arm shed 4 is isolated from the atmosphere inside the outer chamber 2.

The liquid delivery nozzle arm 31 is stored in the liquid delivery nozzle arm shed 3, and is movable by a driving mechanism 52 disposed at the proximal end. Specifically, the arm 31 is rotatable between a position inside the liquid delivery nozzle arm shed 3 and a position above the center of the wafer W inside the outer chamber 2, and is further movable up and down. The distal end of the arm 31 supports a liquid delivery nozzle 51 for delivering a chemical liquid used as a cleaning liquid and purified water used as a rinsing liquid.

On the other hand, the two-fluid spray nozzle arm 32 is stored in the two-fluid spray nozzle arm shed 4, and is movable by a driving mechanism 54 disposed at the proximal end. Specifically, the arm 32 is rotatable between a position inside the two-fluid spray nozzle arm shed 4 and a position above the center of the wafer W inside the outer chamber 2, and is further movable up and down. The distal end of the arm 32 supports a two-fluid spray nozzle 53 for spraying $N_2$ gas and purified water atomized by $N_2$ gas.

Figure 3:
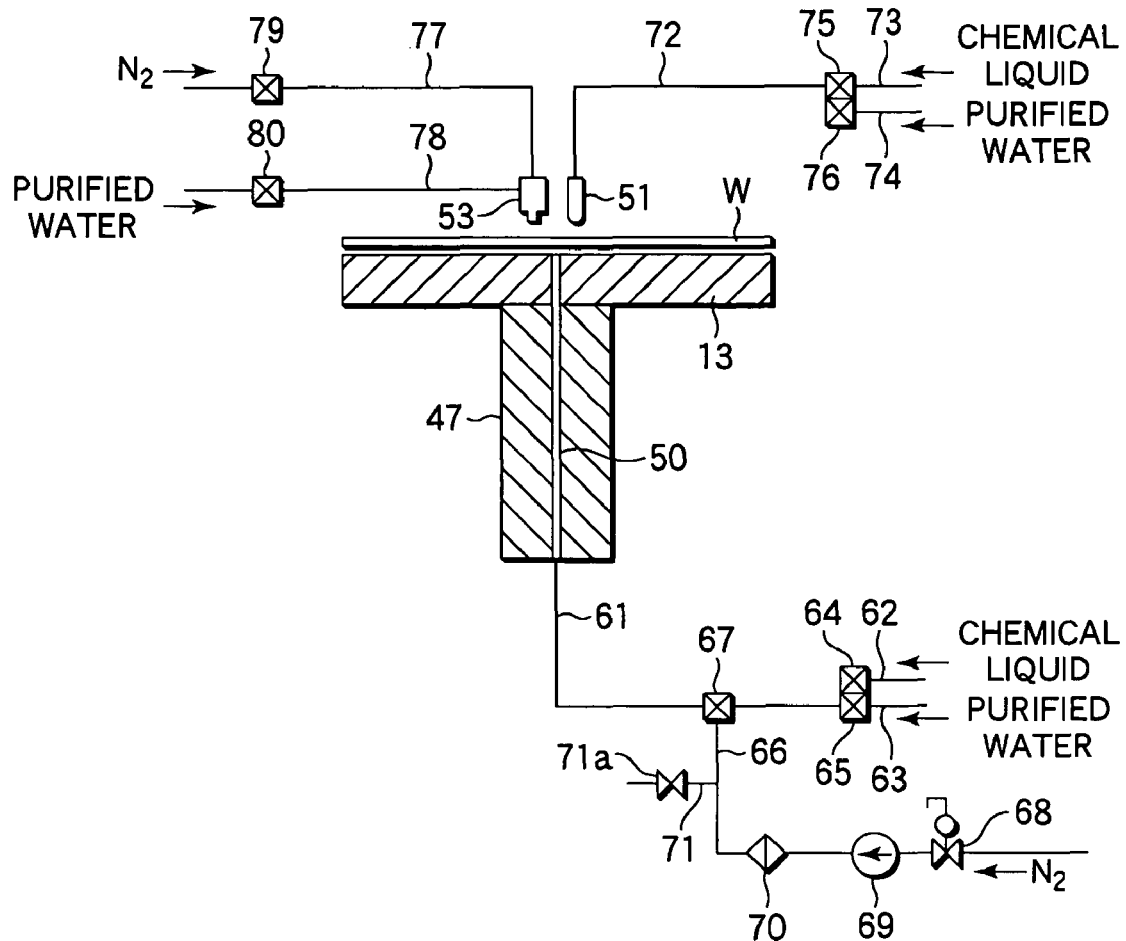
FIG. 3 is a view showing a liquid and gas supply system used in the cleaning apparatus shown in FIG. 1.

FIG. 3 is a view schematically showing a fluid supply system used in the cleaning apparatus 100. As shown in FIG. 3, the back surface cleaning nozzle 50 is connected to a fluid supply line 61. The fluid supply line 61 is connected to a chemical liquid supply line 62 and a purified water supply line 63 respectively through valves 64 and 65, so as to supply a chemical liquid used as a cleaning liquid and purified water used as a rinsing liquid onto the back surface of the wafer W. The fluid supply line 61 is connected, through a valve 67 disposed on the way, to an $N_2$ gas supply line 66 for supplying a $N_2$ gas. The $N_2$ gas supply line 66 is provided with a regulator 68, a flow meter 69, and a filter 70 disposed thereon in this order from the upstream side. Further, at a position downstream from the filter 70, the $N_2$ gas supply line 66 is connected to a release line 71 for releasing the $N_2$ gas pressure outside. The release line 71 is provided with a switching valve 71a disposed thereon.

On the other hand, the liquid delivery nozzle 51 disposed above the front surface of the wafer is connected to a liquid supply line 72. The liquid supply line 72 is connected to a chemical liquid supply line 73 and a purified water supply line 74 respectively through valves 75 and 76, so as to supply a chemical liquid used as a cleaning liquid and purified water used as a rinsing liquid onto the front surface of the wafer W. The two-fluid spray nozzle 53 is connected to an $N_2$ gas line 77 and purified water line 78, so as to atomize purified water by $N_2$ gas and to spray the atomized purified water along with $N_2$ gas therefrom.

Each of the components in the cleaning apparatus 100 is connected to and controlled by the process controller 90 having a CPU. The process controller 90 is connected to a user interface 91, which includes, e.g., a keyboard and a display, wherein the keyboard is used for a process operator to input commands for operating the components in the cleaning apparatus 100, and the display is used for showing visualized images of the operational status of the components in the cleaning apparatus 100. Further, the process controller 90 is connected to the memory portion 92, which stores recipes with control programs and process condition data recorded therein, for realizing various processes performed in the cleaning apparatus 100 under the control of the process controller 90.

A required recipe is retrieved from the storage portion 92 and executed by the process controller 90 in accordance with an instruction or the like input through the user interface 91. Consequently, each of various predetermined processes is performed in the cleaning apparatus 100 under the control of the process controller 90. A recipe may be stored in a readable storage medium, such as a CD-ROM, hard disk, flexible disk, or nonvolatile memory. Further, a recipe may be utilized on-line, while it is transmitted from a suitable apparatus through, e.g., a dedicated line, as needed.

Next, an explanation will be given of a first example of a cleaning process performed in the cleaning apparatus described above. At first, the following state is set up. Specifically, the first shutter 15 of the housing 1 and the second shutter 17 of the outer chamber 2 are opened. The inner cup 11 is set in the retreat position, and the under plate 13 is put in waiting at a position adjacent to the rotary plate 41. Further, the liquid delivery nozzle arm 31 and two-fluid spray nozzle arm 32 are respectively stored in the liquid delivery nozzle arm shed 3 and two-fluid spray nozzle arm shed 4.

Figure 4:
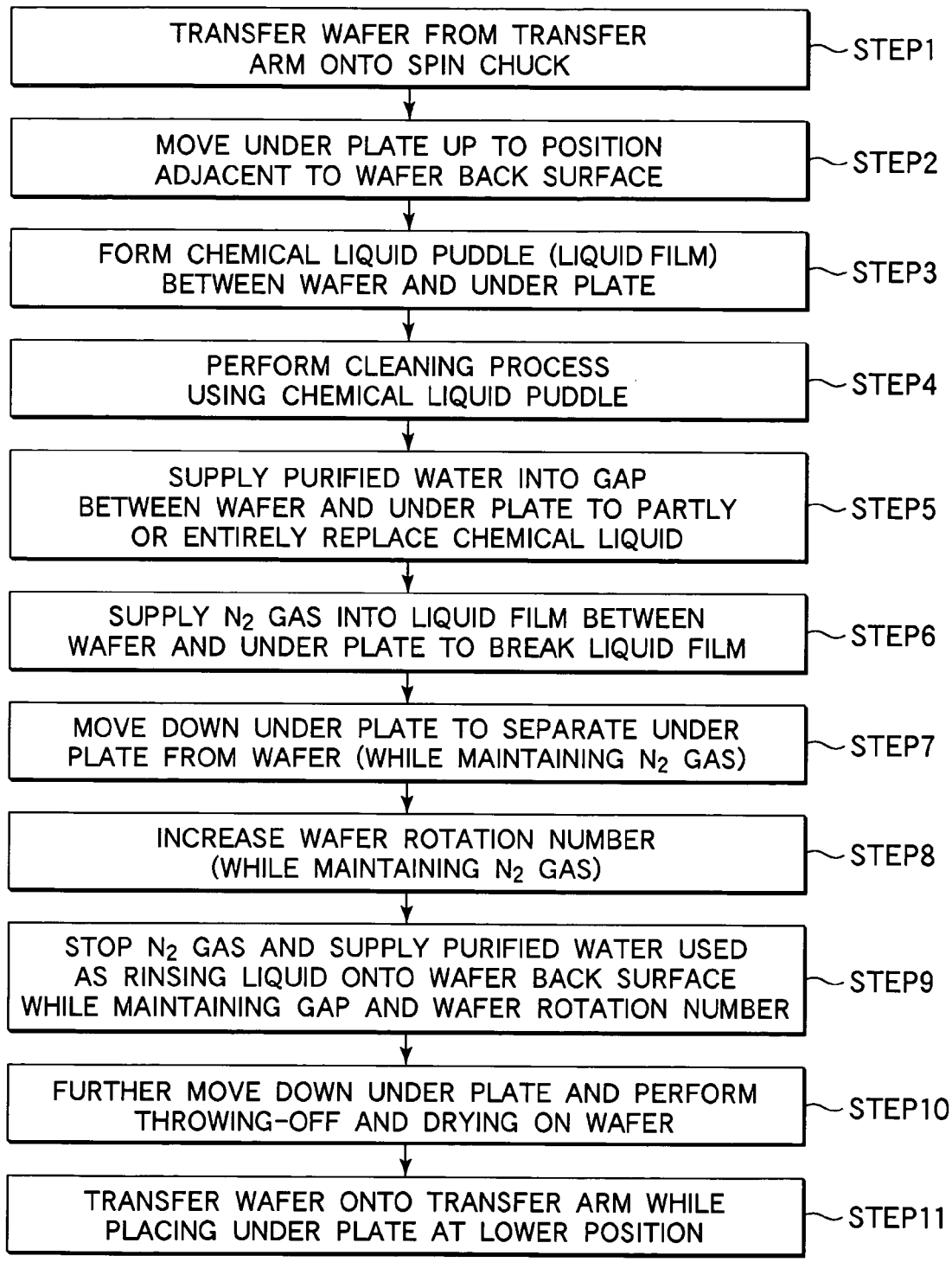
FIG. 4 is a flowchart for explaining an example of the sequence of a cleaning process for the back surface of a wafer, performed by the cleaning apparatus shown in FIG. 1.

In this state, a wafer W is loaded, and then the front and back surfaces of the wafer W are simultaneously cleaned. For the sake of convenience, cleaning performed on the back surface of the wafer W will be first explained. FIG. 4 is a flowchart for explaining an example of the sequence of a cleaning process for the back surface of the wafer W. FIGS. 5A to 5E are schematic views for explaining the process state in main steps in performing the sequence shown in FIG. 4.

At first, the wafer W is transferred by the transfer arm (not shown) onto the support pins 44a disposed on the spin chuck 12 (Step 1). After the wafer W is supported on the support pin 44a and the transfer arm is moved out of the outer chamber 2, the first shutter 15 and second shutter 17 are closed, and the inner cup 11 is moved up to the process position. At this time, the under plate 13 is set at a position to make a gap of 4 mm or more, such as 10 mm or more, between the wafer W and the under plate 13, so as not to obstruct the loading of the wafer W by the under plate 13.

Figure 5A:
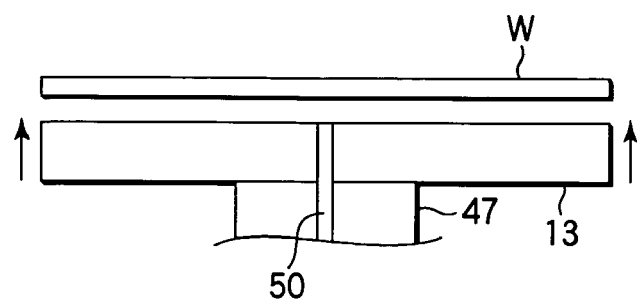
FIGS. 5A to 5E are schematic views for explaining the state inside the apparatus step by step in performing the sequence shown in FIG. 4.

Then, as shown in FIG. 5A, the under plate 13 is moved up to a position adjacent to the back surface of the wafer W held by the spin chuck 12 (Step 2). At this time, the gap between the wafer W and the under plate 13 is set to be 0.5 to 3 mm, such as 0.8 mm. In light of chemical liquid saving, the gap used at this time is preferably set to be as small as possible. Further, at this time, the wafer W is heated by the heater 33 to control the temperature. Also in light of this temperature control, the gap is preferably set to be as small as possible.

Figure 5B:
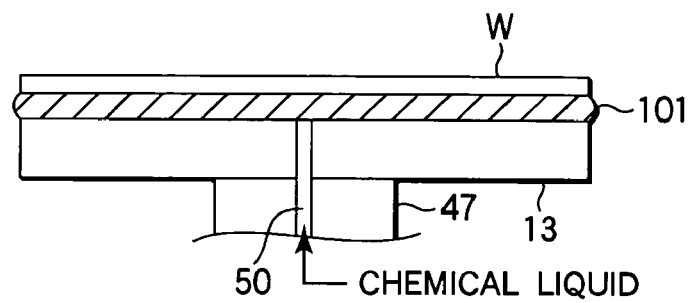

Then, a predetermined chemical liquid used as a cleaning liquid is supplied into the gap between the wafer W and the under plate 13 through the chemical liquid supply line 62, fluid supply line 61, and back surface cleaning nozzle 50. Consequently, as shown in FIG. 5B, a puddle (liquid film) of the chemical liquid is formed on the back surface of the wafer W (Step 3). At this time, the wafer W may be set in a stationary state or may be rotated at a low speed of 100 rpm or less to swiftly spread the chemical liquid. Thus, a puddle 101 of the chemical liquid is formed in several seconds, such as 3 seconds. Then, the puddle 101 of the chemical liquid promotes cleaning on the back surface of the wafer W (Step 4). At this time, the wafer W may be set in a stationary state or may be rotated at a very low speed to agitate the chemical liquid. The time period of this chemical liquid cleaning process is arbitrarily set in accordance with the cleaning level.

Figure 5C:
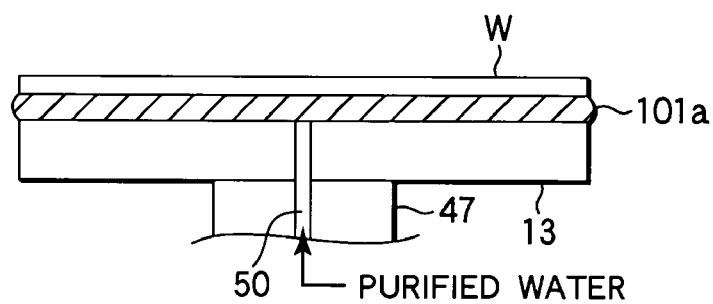

After the chemical liquid cleaning process is finished, purified water used as a rinsing liquid is supplied into the gap between the back surface of the wafer W and the under plate 13 through the purified water supply line 63, fluid supply line 61, and back surface cleaning nozzle 50 (Step 5). This step is performed, while the wafer W is rotated at a low speed of 10 to 100 rpm, such as 50 rpm. Consequently, as shown in FIG. 5C, the chemical liquid of the puddle 101 between the back surface of the wafer W and the under plate 13 is partly or entirely replaced with purified water used as a rinsing liquid, and a liquid film 101a is thereby formed. This step is performed to replace the chemical liquid in the back surface cleaning nozzle 50 and the chemical liquid on the under plate 13 with purified water used as a rinsing liquid. Accordingly, this step needs to be performed only for a short time of several seconds, such as 2 seconds. This step is not indispensable, and the chemical liquid puddle 101 may be maintained as it is, if this step is not performed.

Figure 5D:
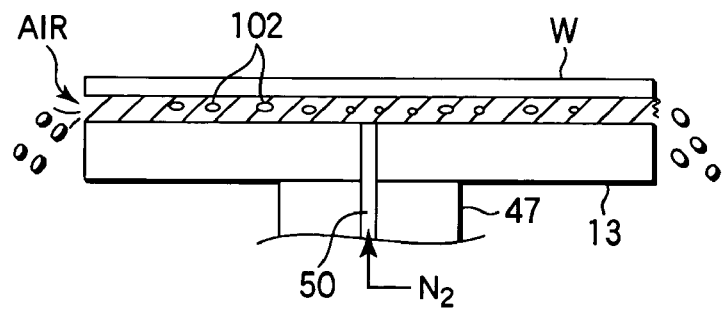

Subsequently, while the wafer W is rotated at a low speed of 10 to 100 rpm, such as 50 rpm, $N_2$ gas is supplied in the gap between the wafer W and the under plate 13 through the $N_2$ gas line 66, fluid supply line 61, and back surface cleaning nozzle 50. Consequently, the liquid film formed in the gap (the liquid film 101a formed by partly or entirely replacing the chemical liquid with purified water, or the chemical liquid puddle 101 not replaced with purified water) is broken by $N_2$ gas thus supplied into the liquid film (Step 6). At this time, as shown in FIG. 5D, the liquid filling the gap between the wafer W and the under plate 13 is partly spilled out of this gap, and the liquid is thereby mixed with gas 102. This step needs to be performed also only for a short time of 1 to 5 seconds, such as 3 seconds.

At this time, there may be a case where the gas pressure inside the $N_2$ gas line 66 is too high. In this case, when the valve 67 is opened, $N_2$ gas is rapidly supplied into the gap between the wafer W and the under plate 13, and causes a problem such that the wafer W is raised or the like. In order to prevent such a problem, the switching valve 71a of the release line 71 is preferably opened in advance to release the pressure inside the $N_2$ gas supply line 66 in Step 5.

Figure 5E:
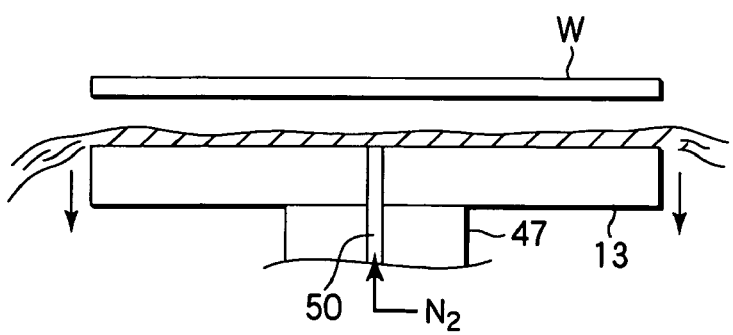

Then, while $N_2$ gas is kept supplied and the wafer W is kept rotated at a low speed, the under plate 13 is moved down to expand the gap between the wafer W and the under plate 13 to 1.5 to 4 mm, such as 1.5 mm, as shown in FIG. 5E (Step 7). The liquid film formed in the gas between the wafer W and the under plate 13 has been broken by $N_2$ gas supplied in Step 6 and mixed with $N_2$ gas. Further, at this time, air enters the liquid film from outside. Consequently, the wafer W is never stuck on the under plate 13, and the wafer W is thereby prevented from suffering warp and/or crack generation.

Subsequently, while $N_2$ gas is kept supplied, the rotation number of the wafer W is increased to 300 rpm or more, such as 1,000 rpm (Step 8). Consequently, the liquid droplets remaining between the wafer W and the under plate 13 are thrown off. At this time, the rotation number of the wafer W should be not too high, because, if the rotation number of the wafer W is too high, the wafer W is stuck on the under plate 13. Each of Steps 6 and 7 needs to be performed also only for a short time of several seconds, such as 2 seconds for Step 6 and 3 seconds for Step 7.

Thereafter, while the gap between the wafer W and the under plate 13 and the rotation number of the wafer W are maintained, supply of $N_2$ gas is stopped, and purified water used as a rinsing liquid is supplied into the gap between the wafer W and the under plate 13 through the purified water supply line 63, fluid supply line 61, and back surface cleaning nozzle 50 (Step 9). At this time, purified water is supplied to collide with the back surface of the wafer W and thereby spread, so that the purified water is not stagnated between the wafer W and the under plate 13.

Thereafter, supply of purified water is stopped, and the under plate 13 is further moved down to expand the gap between the wafer W and the under plate 13 to 4 mm or more, such as 10 mm. Further, the rotation number of the wafer W is set to be 300 rpm or more, such as 1,000 rpm, to perform throwing-off and drying (Step 10). At this time, $N_2$ gas may be supplied to promote drying.

Thereafter, while the gap between the wafer W and the under plate 13 is maintained at 4 mm or more, such as 10 mm, the transfer arm (not shown) is inserted to a position below the wafer W, and then receives the wafer W (Step 11).

Thus, the back surface cleaning process is finished. Table 1 shows a typical example of the sequence of the back surface cleaning process described above.

TABLE 1

| | Step | | | | | | | | | |
|---|---|---|---|---|---|---|---|---|---|---|
| | 1 Transfer by transfer arm | 2 Setting of gap | 3 Formation of chemical liquid puddle | 4 Chemical liquid process | 5 Purified water rinsing | 6 Breaking of liquid film on back surface | 7 Expanding of gap | 8 Increase in wafer rotation number | 9 Purified water rinsing | 10 Spin-drying | 11 Transfer by transfer arm |
| Wafer | 0 rpm | 0 rpm | 100 rpm~0 rm | 0 rpm | 50 rpm | 50 rpm | 50 rpm | 50⇒1000 rpm | 1000 rpm | 1000 rpm | 0 rpm |

TABLE 1-continued

| | Step | | | | | | | | | | |
|---|---|---|---|---|---|---|---|---|---|---|---|
| | 1 Transfer by transfer arm | 2 Setting of gap | 3 Formation of chemical liquid puddle | 4 Chemical liquid process | 5 Purified water rinsing | 6 Breaking of liquid film on back surface | 7 Expanding of gap | 8 Increase in wafer rotation number | 9 Purified water rinsing | 10 Spin-drying | 11 Transfer by transfer arm |
| rotation number | | | | | | | | | | | |
| Processing time | — | — | About 3 seconds | Arbitrary value | 2 seconds | 3 seconds | 2 seconds | 3 seconds | 20 seconds | 30 seconds | — |
| Chemical liquid nozzle for back surface | — | — | Delivery of chemical liquid | Chemical liquid (stop) | Purified water | $N_2$ | $N_2$ | $N_2$ | Purified water | — | — |
| Position of under plate | Gap 10 mm | Gap 0.8 mm | Gap 0.8 mm | Gap 0.8 mm | Gap 0.8 mm | Gap 0.8 mm | Gap 1.5 mm | Gap 1.5 mm | Gap 1.5 mm | Gap 10 mm | Gap 10 mm |

Figure 6:
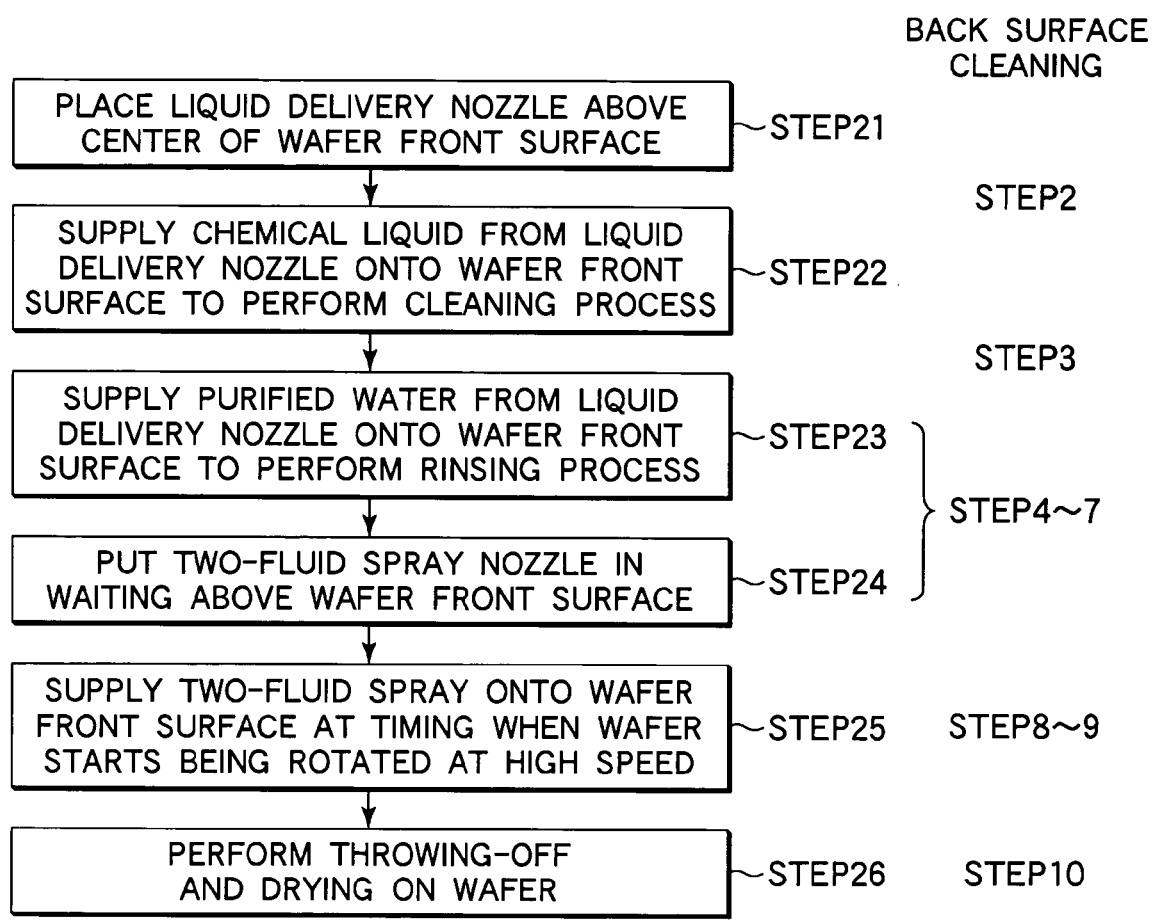
FIG. 6 is a flowchart showing an example of the sequence of a cleaning process for the front surface of a wafer, performed by the cleaning apparatus shown in FIG. 1, in relation to the cleaning process for the back surface shown in FIG. 4.

While the back surface of the wafer W is subjected to the cleaning described above, the front surface of the wafer W is simultaneously subjected to cleaning. FIG. 6 is a flowchart showing a cleaning process for the front surface of the wafer, in relation to the cleaning process for the back surface shown in FIG. 4. As shown in FIG. 6, at first, the liquid delivery nozzle arm 31 is moved into the outer chamber 2, so that the liquid delivery nozzle 51 is positioned above the center of the front surface of the wafer W (Step 21).

Then, when the chemical liquid puddle is formed on the back surface of the wafer W in Step 2, and the back surface cleaning process is performed by the chemical liquid in Step 3, a chemical liquid is supplied onto the front surface of the wafer W through the chemical liquid supply line 73, liquid supply line 72, and liquid delivery nozzle 51, to perform a cleaning process (Step 22). At this time, a predetermined amount of chemical liquid may be supplied onto the front surface of the wafer W to form a puddle (liquid film) to promote the cleaning process. Alternatively, where the back surface cleaning is performed while the wafer W is rotated at a low speed, the front surface cleaning may be performed while the chemical liquid is in a flowing state.

After the chemical liquid cleaning process is finished, purified water is supplied onto the front surface of the wafer W through the purified water supply line 73, liquid supply line 72, and liquid delivery nozzle 51, to perform a rinsing process (Step 23), at the timing when Steps 4 to 7 of the back surface cleaning are performed.

While Step 23 is being performed, the two-fluid spray nozzle arm 32 is moved into the outer chamber 2, so that the two-fluid spray nozzle 52 is put in waiting above the liquid delivery nozzle 51 (Step 24).

Then, at the timing when the wafer starts being rotated at a high speed in Step 8 after the liquid film on the back surface is broken and the gap is expanded, the liquid delivery nozzle 51 is retreated. Further, the two-fluid spray nozzle 52 is moved down to perform two-fluid spray cleaning on the front surface of the wafer W (Step 25). In this two-fluid spray cleaning, two fluids, i.e., atomized purified water and $N_2$ gas, are sprayed from the two-fluid spray nozzle 52 and supplied onto the front surface of the wafer W. Consequently, particles and so forth present on the front surface can be removed very efficiently.

Thereafter, at the timing when the throwing-off and drying of the back surface cleaning starts in Step 10, supply of the two-fluid spray is stopped to perform throwing-off and drying also on the front surface (Step 26).

As described above, when the chemical liquid puddle is broken and the gap is expanded while the wafer is rotated at a low speed after the chemical liquid cleaning in the back surface cleaning, purified water is supplied onto the front surface of the wafer W to perform rinsing and to prevent drying. Then, at the timing when the wafer W is rotated at a high speed, the wafer front surface is cleaned by the two-fluid spray. Consequently, the front surface cleaning can be performed under suitable conditions, which are also suitable for the back surface cleaning.

Next, an explanation will be given of a second example of a cleaning process performed in the cleaning apparatus described above. At first, as in the first example, the following state is set up. Specifically, the first shutter 15 of the housing 1 and the second shutter 17 of the outer chamber 2 are opened. The inner cup 11 is set in the retreat position, and the under plate 13 is put in waiting at a position adjacent to the rotary plate 41. Further, the liquid delivery nozzle arm 31 and two-fluid spray nozzle arm 32 are respectively stored in the liquid delivery nozzle arm shed 3 and two-fluid spray nozzle arm shed 4.

Figure 7:
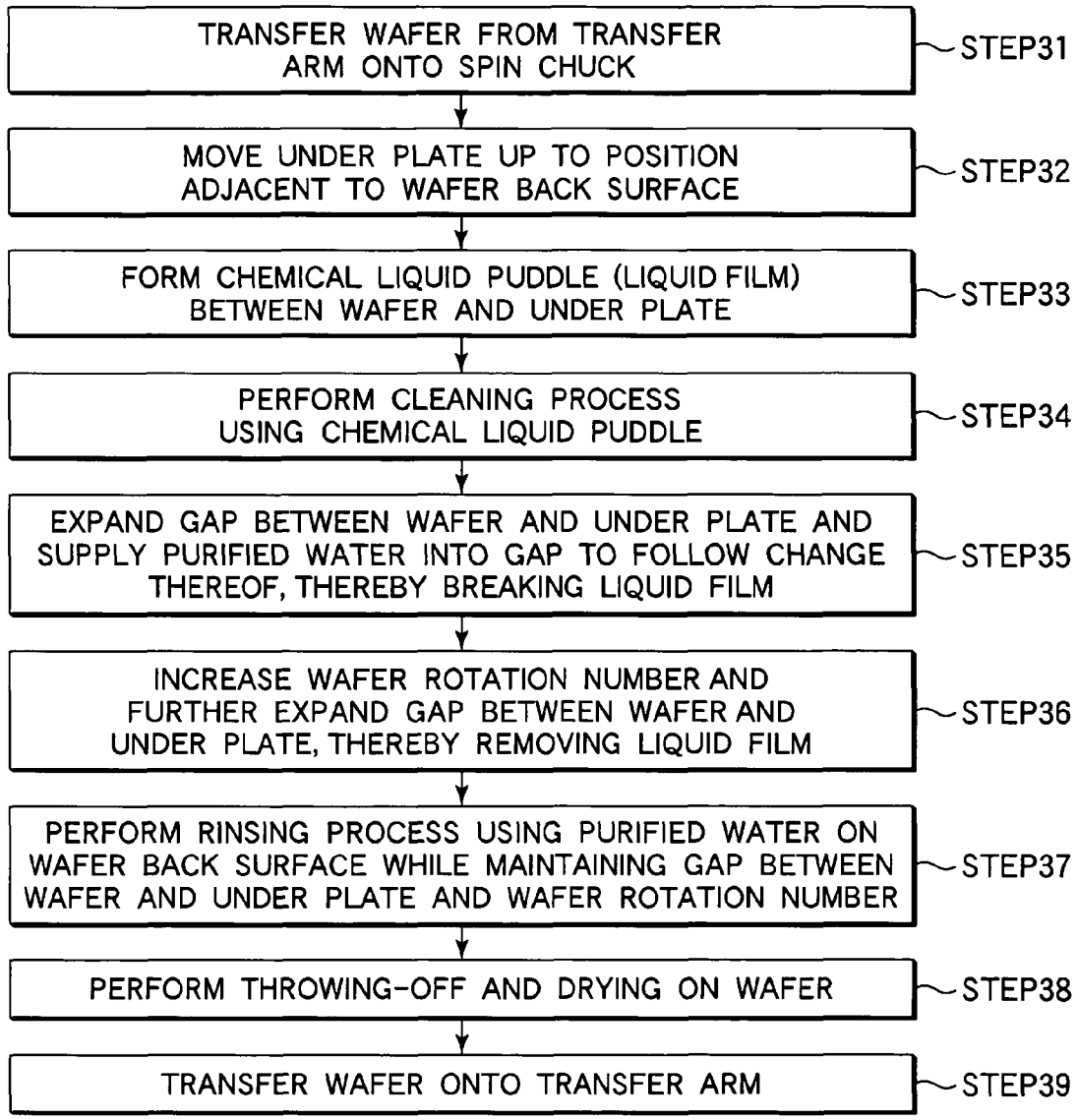
FIG. 7 is a flowchart for explaining another example of the sequence of a cleaning process for the back surface of a wafer, performed by the cleaning apparatus shown in FIG. 1.

In this state, a wafer W is loaded, and then the front and back surfaces of the wafer W are simultaneously cleaned. For the sake of convenience, cleaning performed on the back surface of the wafer W will be first explained. FIG. 7 is a flowchart for explaining an example of the sequence of a cleaning process for the back surface of the wafer W. FIGS. 8A to 8E are schematic views for explaining the process state in main steps in performing the sequence shown in FIG. 7.

At first, the wafer W is transferred by the transfer arm (not shown) onto the support pins 44a disposed on the spin chuck 12 (Step 31). After the wafer W is supported on the support pin 44a and the transfer arm is moved out of the outer chamber 2, the first shutter 15 and second shutter 17 are closed, and the inner cup 11 is moved up to the process position. At this time, the under plate 13 is set at a position to make a gap of 4 mm or more, such as 10 mm or more, between the wafer W and the under plate 13, so as not to obstruct the loading of the wafer W by the under plate 13.

Figure 8A:
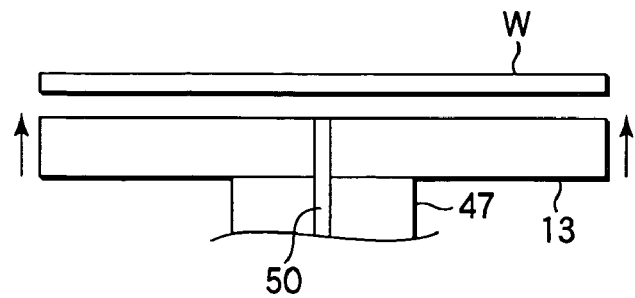
FIGS. 8A to 8E are schematic views for explaining the state inside the apparatus step by step in performing the sequence shown in FIG. 7.

Then, as shown in FIG. 8A, the under plate 13 is moved up to a position adjacent to the back surface of the wafer W held by the spin chuck 12 (Step 32). At this time, the gap between the wafer W and the under plate 13 is set to be 0.5 to 3 mm, such as 0.8 mm. In light of chemical liquid saving, the gap used at this time is preferably set to be as small as possible. Further, at this time, the wafer W is heated by the heater 33 to control the temperature. Also in light of this temperature control, the gap is preferably set to be as small as possible.

Figure 8B:
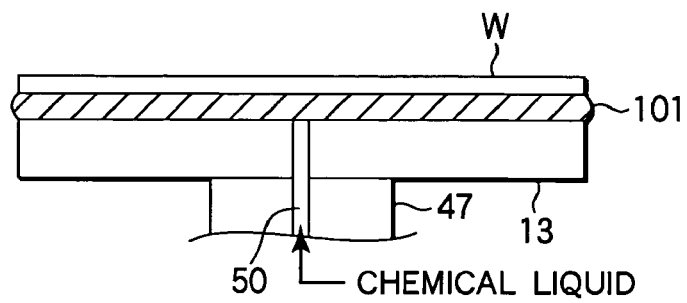

Then, a predetermined chemical liquid used as a cleaning liquid is supplied into the gap between the wafer W and the under plate 13 through the chemical liquid supply line 62, fluid supply line 61, and back surface cleaning nozzle 50. Consequently, as shown in FIG. 8B, a puddle (liquid film) of the chemical liquid is formed on the back surface of the wafer W (Step 33). At this time, the wafer W may be set in a stationary state or may be rotated at a low speed of 100 rpm or less to swiftly spread the chemical liquid. Thus, a puddle 101 of the chemical liquid is formed in several seconds, such as 3 seconds. Then, the puddle 101 of the chemical liquid promotes cleaning on the back surface of the wafer W (Step 34). At this time, the wafer W may be set in a stationary state or may be rotated at a very low speed to agitate the chemical liquid. The time period of this chemical liquid cleaning process is arbitrarily set in accordance with the cleaning level.

After the chemical liquid cleaning process is finished, the under plate 13 is moved down to expand the gap between the wafer W and the under plate 13. Simultaneously, purified water used as a rinsing liquid is supplied into the gap between the wafer W and the under plate 13 through the purified water supply line 63, fluid supply line 61, and back surface cleaning nozzle 50, so as to break the liquid film (Step 35). At this time, the purified water is supplied to follow the change of the gap, so that the amount of purified water reaches a value equal to or more than an increase in the volume of the gap. In this case, when the gap between the wafer W and the under plate 13 is expanded to 3 mm or more, such as 4 mm, the liquid film is broken. This step is performed, while the wafer W is rotated at a low speed of 10 to 100 rpm, such as 50 rpm.

Figure 8C:
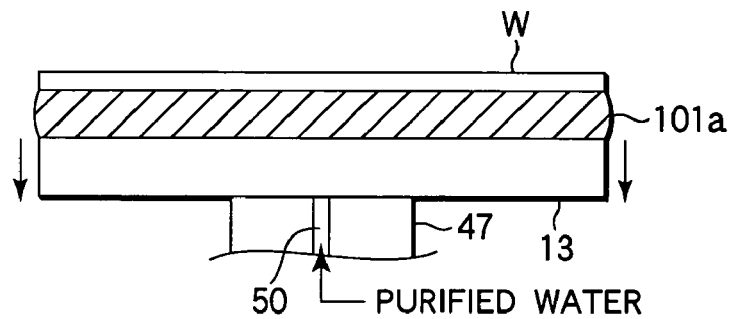
Figure 8D:
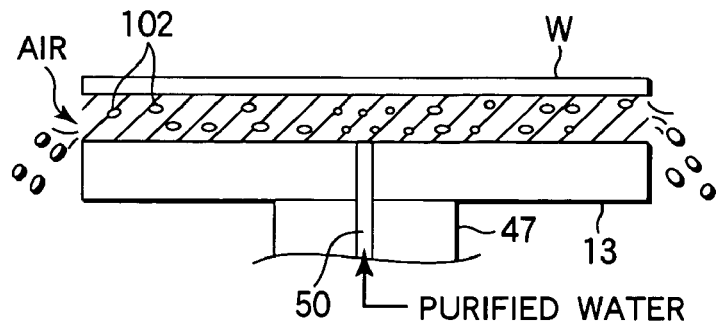

According to this step, as shown in FIG. 8C, when the gap between the wafer W and the under plate 13 is expanded, is mixed into the liquid and the puddle (liquid film) is broken. Once the puddle (liquid film) is broken, another puddle cannot be formed in the gap thereafter, and thus the rotation number can be increased for the subsequent step. Step 35 is preformed for about 5 to 15 seconds, such as 10 seconds.

Figure 8E:
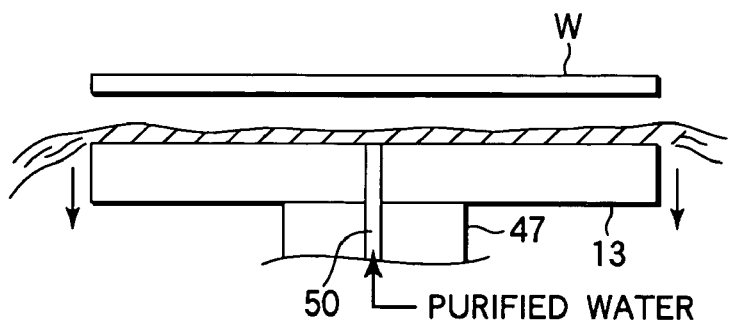

Subsequently, while the rotation number of the wafer W is increased to 300 rpm or more, such as 1,000 rpm, the gap between the wafer W and the under plate 13 is further expanded to 4 mm or more, such as 10 mm. Consequently, as shown in FIG. 8E, the liquid film is removed from the gap between the wafer W and the under plate 13 (Step 36). Step 36 needs to be performed only for a short time of several seconds, such as 3 seconds.

Thereafter, while the gap between the wafer W and the under plate 13 is maintained and the rotation number of the wafer W is maintained at 300 rpm or more, such as 1,000 rpm, purified water used as a rinsing liquid is supplied into the gap between the wafer W and the under plate 13 to perform a rinsing process (Step 37). At this time, purified water is supplied to collide with the back surface of the wafer W and thereby spread, so that the purified water is not stagnated between the wafer W and the under plate 13.

Thereafter, while supply of purified water is stopped, and the gap between the wafer W and the under plate 13 is maintained, the rotation number of the wafer W is set to be 300 rpm or more, such as 1,000 rpm, to perform throwing-off and drying (Step 38). At this time, $N_2$ gas may be supplied to promote drying.

Thereafter, while the gap between the wafer W and the under plate 13 is maintained at 4 mm or more, such as 10 mm, the transfer arm (not shown) is inserted to a position below the wafer W, and then receives the wafer W (Step 39).

Thus, the back surface cleaning process is finished. Table 2 shows a typical example of the sequence of the back surface cleaning process described above.

TABLE 2

| | | | | | 35 Purified water rinsing at low speed (expanding of gap) | | | | |
|---|---|---|---|---|---|---|---|---|---|
| | 31 Transfer by transfer arm | 32 Setting of gap | 33 Formation of chemical liquid puddle | 34 Chemical liquid process | | 36 Increase in wafer rotation number | 37 Rinsing process | 38 Spin-drying | 39 Transfer by transfer arm |
| Wafer rotation number | 0 rpm | 0 rpm | 100 rpm~0 rm | 0 rpm | 50 rpm | 50⇒1000 rpm | 1000 rpm | 1000 rpm | 0 rpm |
| Processing time | — | — | About 3 seconds | Arbitrary value | 10 seconds | 3 seconds | Arbitrary value | 30 seconds | — |
| Chemical liquid nozzle for back surface | — | — | Delivery of chemical liquid | stop | Purified water | Purified water | Purified water | — | — |
| Gap | 10 mm | 0.88 mm | 0.8 mm | 0.8mm | 0.8 mm⇒4 mm | 4 mm⇒10 mm | 10 mm | 10 mm | 10 mm | purified water is supplied to follow the change of the gap. In this case, the gap can maintain a state of being filled with a puddle 101a formed of a mixture of the chemical liquid and purified water. Consequently, the gap does not fall into a vacuum state, and the wafer W is thereby prevented from being stuck on the under plate 13 and thus prevented from suffering warp and/or crack generation. When the gap is expanded to the distance described above, as shown in FIG. 8D, air gradually flows into the gap from outside, so gas 102

Figure 9:
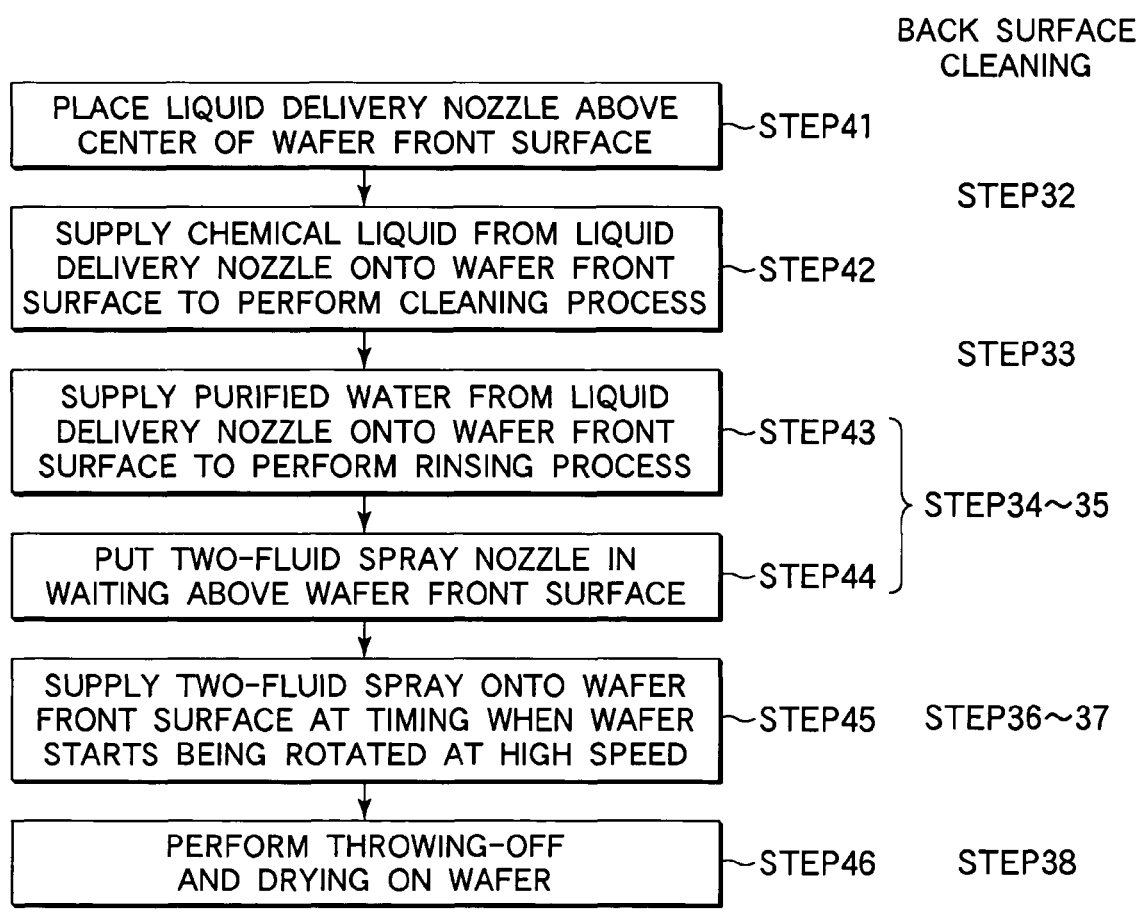
FIG. 9 is a flowchart showing an example of the sequence of a cleaning process for the front surface of a wafer, performed by the cleaning apparatus shown in FIG. 1, in relation to the cleaning process for the back surface shown in FIG. 7.

While the back surface of the wafer W is subjected to the cleaning described above, the front surface of the wafer W is simultaneously subjected to cleaning. FIG. 9 is a flowchart showing a cleaning process for the front surface of the wafer, in relation to the cleaning process for the back surface shown in FIG. 7. As shown in FIG. 9, at first, the liquid delivery nozzle arm 31 is moved into the outer chamber 2, so that the liquid delivery nozzle 51 is positioned above the center of the front surface of the wafer W (Step 41).

Then, when the chemical liquid puddle is formed on the back surface of the wafer W in Step 32, and the back surface cleaning process is performed by the chemical liquid in Step 33, a chemical liquid is supplied onto the front surface of the wafer W through the chemical liquid supply line 73, liquid supply line 72, and liquid delivery nozzle 51, to perform a cleaning process (Step 42). At this time, a predetermined amount of chemical liquid may be supplied onto the front surface of the wafer W to form a puddle (liquid film) to promote the cleaning process. Alternatively, where the back surface cleaning is performed while the wafer W is rotated at a low speed, the front surface cleaning may be performed while the chemical liquid is in a flowing state.

After the chemical liquid cleaning process is finished, purified water is supplied onto the front surface of the wafer W through the purified water supply line 73, liquid supply line 72, and liquid delivery nozzle 51, to perform a rinsing process (Step 43), at the timing when Steps 34 to 35 of the back surface cleaning are performed.

While Step 43 is being performed, the two-fluid spray nozzle arm 32 is moved into the outer chamber 2, so that the two-fluid spray nozzle 52 is put in waiting above the liquid delivery nozzle 51 (Step 44).

Then, at the timing when the wafer starts being rotated at a high speed in Step 36, the liquid delivery nozzle 51 is retreated. Further, the two-fluid spray nozzle 52 is moved down to perform two-fluid spray cleaning on the front surface of the wafer W (Step 45). In this two-fluid spray cleaning, two fluids, i.e., atomized purified water and $N_2$ gas, are sprayed from the two-fluid spray nozzle 52 and supplied onto the front surface of the wafer W. Consequently, particles and so forth present on the front surface can be removed very efficiently.

Thereafter, at the timing when the throwing-off and drying of the back surface cleaning starts in Step 38, supply of the two-fluid spray is stopped to perform throwing-off and drying also on the front surface (Step 46).

As described above, when the gap is expanded while the wafer is rotated at a low speed after the chemical liquid cleaning in the back surface cleaning, purified water is supplied onto the front surface of the wafer W to perform rinsing and to prevent drying. Then, at the timing when the wafer W is rotated at a high speed, the wafer front surface is cleaned by the two-fluid spray. Consequently, the front surface cleaning can be performed under suitable conditions, which are also suitable for the back surface cleaning.

Figure 10:
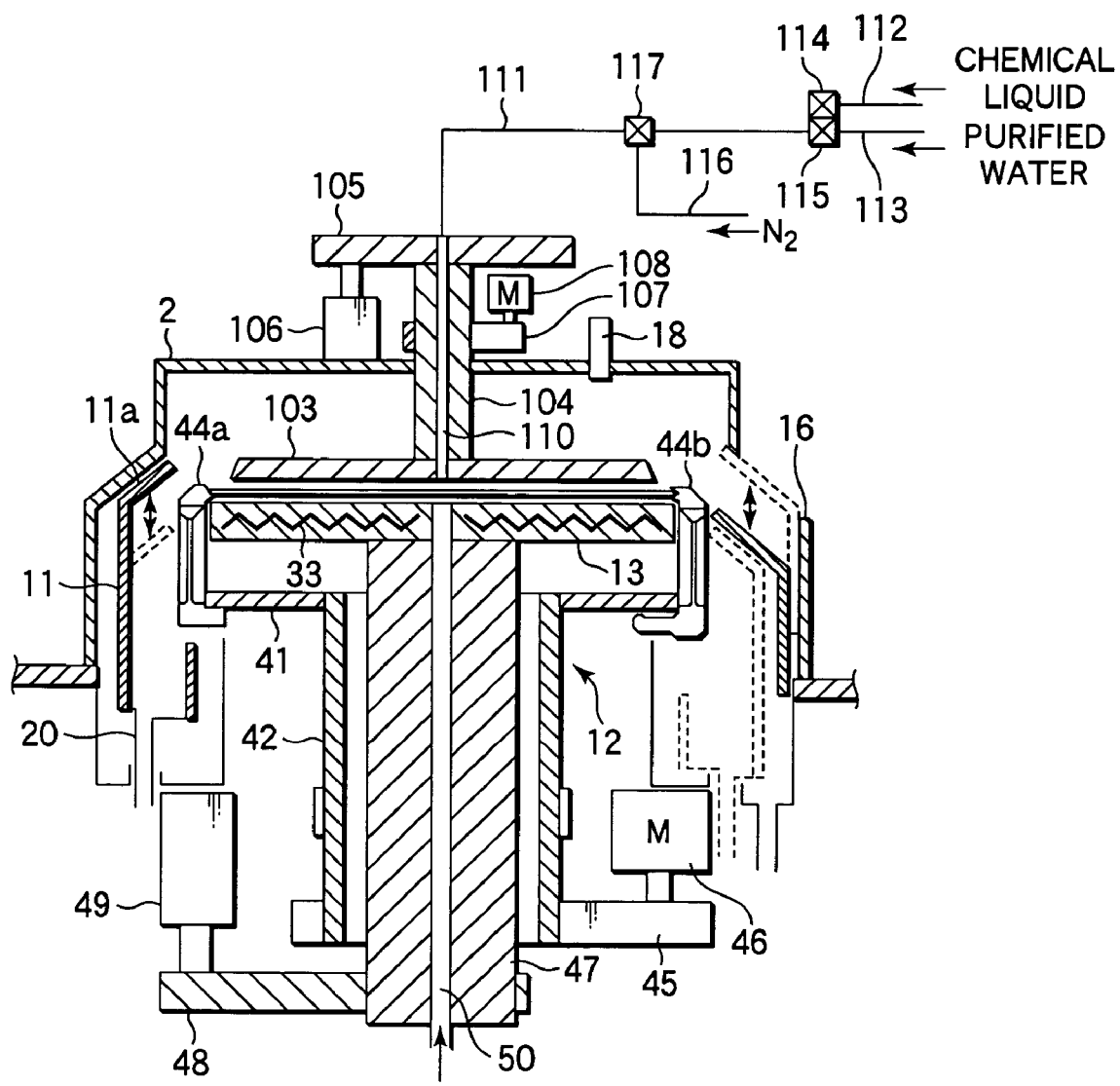
FIG. 10 is a sectional view schematically showing the structure of another example of a cleaning apparatus usable for implementing the present invention.

In the embodiment described above, the under plate 13 is disposed in association with the back surface of the wafer W to form a puddle between the back surface of the wafer W and the under plate 13. Similarly, as shown in FIG. 10, a top plate 103 may be disposed above a wafer W to form a chemical liquid puddle between the front surface of the wafer W and the top plate 103.

A detailed explanation will be given of this structure, with reference to FIG. 10. The top plate 103 is connected to the lower end of a rotary shaft 104 extending downward inside the outer chamber 2 from above the outer chamber 2. The rotary shaft 104 is rotatably supported at the upper end by a horizontal plate 105. The horizontal plate 105 is arranged to be moved up and down by an elevating mechanism 106, such as an air cylinder, fixed to the top wall of the outer chamber 2. The top plate 103 is movable up and down by the elevating mechanism 106 through the horizontal plate 105 and rotary shaft 104. A belt 107 is wound around the rotary shaft 104, and is arranged to be driven by a motor 108. When the belt 107 is driven by the motor 108, the top plate 103 is rotated through the rotary shaft 104. Although the top plate 103 is not necessarily required to be rotatable, this arrangement is effective in a case where a relative movement between the wafer W and top plate is required in the front surface cleaning while the wafer W needs to be stationary in the back surface cleaning.

A front surface cleaning nozzle 110 is formed in the horizontal plate 105, rotary shaft 104, and top plate 103 to extend therethrough. The front surface cleaning nozzle 110 is connected to a fluid supply line 111. The fluid supply line 111 is connected to a chemical liquid supply line 112 and a purified water supply line 113 respectively through valves 114 and 115, so as to supply a chemical liquid used as a cleaning liquid and purified water used as a rinsing liquid onto the front surface of the wafer W. The fluid supply line 111 is connected, through a valve 117 disposed on the way, to an $N_2$ gas supply line 116 for supplying a $N_2$ gas. Since the $N_2$ gas supply line 116 is arranged to be the same as the $N_2$ gas supply line 66, the structure thereof will not explained in detail.

With this arrangement, while the top plate 103 is set to be adjacent to the front surface of the wafer W, a chemical liquid is supplied into the gap between the front surface of the wafer W and the top plate 103. Consequently, a puddle (liquid film) of the chemical liquid is formed in the gap and promotes the cleaning process. Thus, a series of processes can be performed in the same sequence as that of the cleaning for the back surface of the wafer W. Namely, a chemical liquid puddle is formed, then a chemical liquid cleaning process is performed, then the chemical liquid puddle is broken, then the top plate is separated, then a rinsing process is performed, and then a drying process is performed. However, since the wafer front surface requires high cleanliness, two-fluid spray cleaning is preferably performed as described above after the rinsing process. In this case, after the rinsing process, the top plate is retreated upward. Then, the two-fluid spray nozzle arm 32 is moved in the outer chamber 2, and atomized purified water and $N_2$ gas are supplied from the two-fluid spray nozzle 52.

As described above, a cleaning process is performed on the front surface of the wafer W while a puddle (liquid film) is formed between the top plate and wafer W. However, also in this case, when the top plate is separated from the wafer W, the wafer W is prevented from being stuck on the top plate. Consequently, the wafer W is prevented from suffering warp and/or breakage generation.

The present invention is not limited to the embodiments described above, and it may be modified in various manners. For example, in the embodiments described above, a method according to the present invention is used for cleaning the back surface or back and front surfaces of a wafer treated as a target substrate. Alternatively, a method according to the present invention may be used for cleaning only a front surface of a wafer treated as a target substrate.

In the first example described above of a cleaning process according to the embodiments, $N_2$ gas is used as a gas for breaking a liquid film, but this is not limiting. A gas selected from other inactive gases, such as Ar gas, and other various gases may be used for this purpose, as long as it does not affect the liquid process.

In the second example described above of a cleaning process according to the embodiments, purified water used as a rinsing liquid is utilized as a liquid for breaking the liquid film. However, another liquid may be used for this purpose, as long as it does not affect the substrate process.

Further, in the embodiments described above, a semiconductor wafer is treated as a target substrate. However, the present invention may be applied to another substrate, such as a substrate for a flat panel display (FPD), representative of which is a glass substrate for a liquid crystal display (LCD).

Furthermore, in the embodiments described above, the present invention is applied to a cleaning process. However, the present invention may be applied to another liquid process.

What is claimed is:

1. A liquid processing method comprising:
placing a plate to adjacently face at least one surface of a target substrate held in a horizontal state, and supplying a chemical liquid into a gap between the plate and the target substrate, thereby forming a chemical liquid film filling the gap in a vertical direction;
subjecting the target substrate to a process using a state with the chemical liquid film thus formed, whereupon the liquid film is used;
then supplying a rinsing liquid into the gap and replacing the chemical liquid film partly or entirely with the rinsing liquid, thereby forming a secondary liquid film filling the gap in a vertical direction;
then supplying a gas to the secondary liquid film filling the gap in the vertical direction, thereby breaking the secondary liquid film;
then expanding the gap in a vertical direction;
then supplying the rinsing liquid onto said at least one surface of the target substrate while rotating the target substrate, thereby performing a rinsing process; and
then performing throwing-off and drying by rotating the target substrate.

2. The liquid processing method according to claim 1, wherein the chemical liquid is supplied into the gap from a nozzle disposed at a central portion of the plate.

3. The liquid processing method according to claim 1, wherein the method further comprises releasing pressure inside a gas line for supplying the gas to the secondary liquid film before said breaking the secondary liquid film.

4. The liquid processing method according to claim 1, wherein said expanding the gap is performed while rotating the target substrate at a first rotation number that defines a relatively lower speed; and the method further comprises then increasing the rotation number of the target substrate to a second rotation number that defines a higher speed than the speed defined by the first rotation number.

5. The liquid processing method according to claim 4, wherein the first rotation number is set to be 10 to 100 rpm, and the second rotation number is set to be 100 to 1,000 rpm.

6. The liquid processing method according to claim 1, wherein the gap has a constant vertical dimension from said forming the chemical liquid to said breaking the secondary liquid film.

7. A liquid processing method comprising:
placing a plate to adjacently face at least one surface of a target substrate held in a horizontal state, and supplying a chemical liquid into a gap between the plate and the target substrate, thereby forming a chemical liquid film filling the gap in a vertical direction;
subjecting the target substrate to a process using a state with the chemical liquid film thus formed;
then supplying a rinsing liquid into the gap and replacing the chemical liquid film partly or entirely with the rinsing liquid, thereby forming a secondary liquid film filling the gap in a vertical direction;
then supplying a gas to the secondary liquid film filling the gap in the vertical direction, thereby breaking the secondary liquid film;
then expanding the gap in the vertical direction;
then rotating the target substrate, thereby throwing-off and removing the secondary liquid film thus broken;
then supplying the rinsing liquid onto said at least one surface of the target substrate while rotating the target substrate, thereby performing a rinsing process; and
then performing throwing-off and drying by rotating the target substrate.

8. The liquid processing method according to claim 7, wherein the gap has a constant vertical dimension from said forming the chemical liquid to said breaking the secondary liquid film.

9. A liquid processing method comprising:
placing a plate to adjacently face a back surface of a target substrate held in a horizontal state, and supplying a chemical liquid into a gap between the plate and the target substrate, thereby forming a chemical liquid film filling the gap in a vertical direction;
subjecting the target substrate to a back side process using a state with the chemical liquid film thus formed;
then supplying a rinsing liquid into the gap and replacing the chemical liquid film partly or entirely with the rinsing liquid, thereby forming a secondary liquid film filling the gap in a vertical direction;
then supplying a gas to the secondary liquid film filling the gap in the vertical direction, thereby breaking the secondary liquid film;
then expanding the gap in the vertical direction while rotating the target substrate at a first rotation number that defines a relatively lower speed;
then increasing the rotation number of the target substrate to a second rotation number larger than the first rotation number, thereby throwing-off and removing the secondary liquid film thus broken from the back surface of the target substrate;
then supplying the rinsing liquid onto the back surface of the target substrate while rotating the target substrate, thereby performing a rinsing process;
supplying the chemical liquid onto a front surface of the target substrate, thereby subjecting the front surface to a front side process, while the back side process on the back surface of the target substrate is proceeding;
supplying a front side rinsing liquid onto the front surface of the target substrate, thereby performing rinsing thereon, after finishing the front side process; and
switching the front side rinsing liquid supplied onto the front surface of the target substrate to a two-fluid spray comprising purified water atomized by a gas, at timing when the first rotation number is increased to the second rotation number.

10. The liquid processing method according to claim 9, wherein the first rotation number is set to be 10 to 100 rpm, and the second rotation number is set to be 100 to 1,000 rpm.

11. The liquid processing method according to claim 9, wherein the gap has a constant vertical dimension from said forming the chemical liquid to said breaking the secondary liquid film.

12. The liquid processing method according to claim 9, wherein the method further comprises rotating the target substrate at a high speed, thereby performing throwing-off and drying after supplying the two-fluid spray.

13. A liquid processing method comprising:
placing a plate to adjacently face at least one surface of a target substrate held in a horizontal state, with a first distance therebetween, and supplying a chemical liquid into a gap between the plate and the target substrate, thereby forming a chemical liquid film filling the gap in a vertical direction, and performing a liquid process using a state with the chemical liquid film thus formed;

stopping supply of the chemical liquid, and then supplying a rinsing liquid into the gap having the first distance and replacing the chemical liquid film partly or entirely with the rinsing liquid, thereby forming a secondary liquid film filling the gap in a vertical direction;

then supplying a gas to the secondary liquid film filling in the vertical the gap having the first distance; thereby breaking the secondary liquid film;

then expanding the gap in a vertical direction to a second distance larger than the first distance, while supplying the gas into the gap;

then supplying the rinsing liquid onto said at least one surface of the target substrate while rotating the target substrate, thereby performing a rinsing process; and then performing throwing-off and drying by rotating the target substrate.

14. The liquid processing method according to claim 13, wherein the method further comprises:

rotating the target substrate, while supplying the gas to the secondary liquid film; and providing an increase in rotation number of the target substrate, when expanding the gap to the second distance.

15. The liquid processing method according to claim 13, wherein after the rinsing process, the method further comprises expanding the gap to a third distance larger than the second distance, and stopping supply of the rinsing liquid.

16. A non-transitory computer readable storage medium that stores a control program for execution on a computer, wherein the control program, when executed, causes the computer to control a liquid processing apparatus to conduct a liquid processing method comprising:

placing a plate to adjacently face at least one surface of a target substrate held in a horizontal state, and supplying a chemical liquid into a gap between the plate and the target substrate, thereby forming a chemical liquid film filling the gap in a vertical direction;

subjecting the target substrate to a process using a state with the chemical liquid film thus formed;

then supplying a rinsing liquid into the gap and replacing the chemical liquid film partly or entirely with the rinsing liquid, thereby forming a secondary liquid film filling a gap in a vertical direction;

then supplying a gas to the secondary liquid film filling the gap in the vertical direction, thereby breaking the secondary liquid film;

then expanding the gap in a vertical direction;

then supplying the rinsing liquid onto said at least one surface of the target substrate while rotating the target substrate, thereby performing a rinsing process; and then performing throwing-off and drying by rotating the target substrate.

17. The non-transitory computer readable storage medium according to claim 16, wherein the gap has a constant vertical dimension from said forming the chemical liquid to said breaking the secondary liquid film.

* * * * *